(12) United States Patent
May et al.

(10) Patent No.: US 6,325,272 B1
(45) Date of Patent: Dec. 4, 2001

(54) APPARATUS AND METHOD FOR FILLING A BALL GRID ARRAY

(75) Inventors: John May, Tucson; Timothy J. Provencher, Oro Valley, both of AZ (US)

(73) Assignee: Robotic Vision Systems, Inc., Canton, MA (US)

( * ) Notice: Subject to any disclaimer, the term of this patent is extended or adjusted under 35 U.S.C. 154(b) by 0 days.

(21) Appl. No.: 09/169,851

(22) Filed: Oct. 9, 1998

(51) Int. Cl.[7] ............................. B23K 31/00; B23K 35/00
(52) U.S. Cl. ............................................. 228/41; 228/246
(58) Field of Search ...................... 228/41, 245, 180.22, 228/246, 6.1, 6.2, 33

(56) References Cited

U.S. PATENT DOCUMENTS

| | | | |
|---|---|---|---|
| 3,373,481 | 3/1968 | Lins et al. | 29/471.3 |
| 4,587,703 | 5/1986 | Azizi et al. | 29/431 |
| 4,871,110 | 10/1989 | Fukasawa et al. | 228/245 |
| 4,989,845 | 2/1991 | Kurita | 269/21 |
| 5,095,608 | 3/1992 | Kurita | 29/559 |
| 5,118,027 | 6/1992 | Braun et al. | 228/180.2 |
| 5,284,287 | 2/1994 | Wilson et al. | 228/180.2 |
| 5,293,072 | 3/1994 | Tsuji et al. | 257/737 |
| 5,403,776 | 4/1995 | Tsuji et al. | 437/183 |
| 5,445,313 | * 8/1995 | Boyd et al. . | |
| 5,467,913 | 11/1995 | Namekawa et al. | 228/41 |
| 5,626,277 | 5/1997 | Kawada | 228/41 |
| 5,707,051 | 1/1998 | Tsuji | 269/21 |
| 5,762,258 | 6/1998 | Le Coz et al. | 228/56.3 |
| 5,983,490 | * 11/1999 | Sakemi . | |
| 6,095,398 | * 8/2000 | Takahashi et al. . | |
| 6,158,649 | * 12/2000 | Miura . | |

* cited by examiner

*Primary Examiner*—M. Alexandra Elve
*Assistant Examiner*—Kiley Stoner
(74) *Attorney, Agent, or Firm*—Sullivan Law Group

(57) ABSTRACT

An apparatus for placing solder balls in a pattern on a substrate, e.g., to form a ball grid array, the apparatus comprising a template having a first plane, a second plane, and a plurality of holes passing substantially orthogonally through the first and second planes parallel to an axis and corresponding in location to the pattern. Each of the holes is slightly larger than a solder ball diameter. The apparatus also including a porous base having first and second planes, wherein the first plane of the base contacts the second plane of the template. The base is permeable to a fluid in a first direction from the first plane of the template toward the second plane of the base. The apparatus further includes a fluid controller in fluid communication with the base for selectively causing the fluid to pass through the holes and through the base in the first direction to force the solder balls into the holes. The base optionally but preferably comprises a carbon material, such as a carbon graphite material, and the fluid preferably comprises air.

16 Claims, 4 Drawing Sheets

APPARATUS AND METHOD FOR FILLING A BALL GRID ARRAY

BACKGROUND OF THE INVENTION

1. Field of the Invention

The present invention relates to apparatus and methods pertaining to ball grid array technology and, more specifically, to apparatus and methods for filling a ball grid array with solder balls.

2. Description of the Related Art

The electronics industry is one of the most dynamic and important industries today. It has literally transformed the world and provides many products that affect our daily lives, for example, telephones, television, personal computers, cellular phones, pagers, video camcorders, audiovisual products, etc. One of the key technologies that helps make these products possible is electronics packaging. This field of technology can be divided into a hierarchy of levels beginning with chip level packages and proceeding to multi-chip packages, printed circuit boards, mother boards, and component cases including boards, power supplies, etc.

A key area of development in the field of electronic packaging is the area of chip level packaging and interconnections. The most common types of chip level interconnections are wire bonding, tape-automated bonding (TAB), and solder bumping. Among these three technologies, solder bumped flip chip provides the highest level of packaging density with the least package space. The solder bumping is created by solder balls which are reflowed onto connection points or pads on the chip and/or the package. The solder balls are arranged in arrays on the chips and the packages. These arrays are known as ball grid arrays ("BGA").

Ball grid array packaging is rapidly emerging as the technology of choice for high input/output (I/O) count integrated circuits (IC's). Ball grid arrays deliver higher density and yields than traditional packages without requiring fine-pitch processing or new assembly equipment. Driven by the increasing I/O as IC's become larger and more complex, the demand for ball grid array packages is expected to grow from fewer than 20 million units in 1995 to more than 2 billion by 1999.

In BGA technology, the solder balls must be placed onto desired locations in an array on the substrate. "Substrate" as the term is used herein refers to the item upon which the solder balls are to be placed and bonded to form the ball grid array. Examples of such substrates include printed circuit boards, flux circuits, and ceramic panels. They may be housed in the form of individual chips or boards, or held in carriers such as boats or trays.

Each substrate typically includes a plurality of solder sites or pads positioned in an array corresponding to the desired pattern of bonding sites for the substrate. The solder pads typically comprise a metal pad, for example, measuring slightly smaller than the solder ball which is to be placed upon the solder pad.

The solder balls typically used in BGA technologies generally comprise eutectic solders such as tin-lead solders, solder coated copper, or high temperature alloys. Examples of tin-lead solder ball compositions are 63% tin—37% lead and 62% tin—36% lead—2% silver, typically for use with plastic ball grid arrays, and 10% tin—90% lead, typically for use with ceramic ball grid arrays, although other compositions are possible. The solder balls used in current applications typically have sizes ranging from as small as 5 mills (thousandths of an inch) to as large as 30 mills. Other sizes and size ranges have been used in the past and quite well may be used in the future. In a given application, a single size of solder ball is commonly used, although this is not necessarily true universally. As used herein, the term "solder ball" is used to refer to the generally spherical unit of bonding material used in the ball grid array to bond and electrically couple the solder pads or bonding sites on the substrate to an object to which the substrate is to be electrically coupled.

It is generally a necessity for high-quality ball grid array technology that the solder balls be accurately placed on the solder pads. In most applications, it is also a requirement that one and only one solder ball be placed on each solder pad. Moreover, this precision placement must be done in a way which preserves the phyiscal and geometric integrity of the solder ball. It is generally unacceptable, for example, for any deformation of the solder balls, slicing of the solder balls, etc. to occur. When a solder ball is cut in two during processing, for example, it is generally necessary to stop the process, inspect the solder ball reservoir for ball fragments, and to remove those ball fragments before processing can continue.

The placement of the individual solder balls onto a substrate in the ball grid array pattern traditionally has been done using a stencil or template. The template includes a number of holes positioned in a pattern corresponding to the solder pads on the substrate. Each hole is slightly large then the diameter of the solder balls, so that one solder ball easily slides or falls into each hole.

The substrate generally has been previously processed so that a flux has been applied to the solder pads. The flux interacts with the solder of the solder balls in known fashion to facilitate bonding, for example, to act as a pad cleaning and wetting agent.

The substrate and/or the template are moved relative to one another so that the substrate contacts the template, and the array of holes in the template are aligned with the solder pads on the substrate. Solder balls then are distributed so that one solder ball is placed into each of the holes. The solder balls thus rest upon and are in contact with the respective solder pads. The template then is removed, and the substrate, including the properly-positioned solder balls, are further processed, such as by placing them into a reflux oven to melt the solder balls and thereby bond the solder balls to the solder pads.

A number of methods and apparatus have been developed for distributing the solder balls into the holes of the template, and otherwise for the handling, control and placement of the solder balls. U.S. Pat. No. 5,499,487, issued to McGill on Mar. 19, 1996 and U.S. Pat. No. 5,551,216, issued to McGill on Sep. 3, 1996, provide examples. In these patents, a device is disclosed which comprises an apparatus for placing solder balls in a ball grid array. The apparatus includes a wheel having an inner and outer face, wherein the wheel is rotatable about a horizontal axis. The apparatus includes means for attaching a ball grid array to the inner face of the wheel, means for attaching a tooling fixture to the outer face of the wheel in position corresponding to that of said ball grid array, means for forming a reservoir of solder balls at the bottom of the wheel, and means for controllably rotating the wheel to move the tooling fixture through the reservoir in a manner to fill recesses in the fixture with solder balls and to remove from the surface of the array any excess solder balls which are not occupying recesses. The inner and outer faces are separated a distance to permit the tooling fixture to engage solder balls in the reservoir while the ball grid array does not engage the solder balls.

The solder balls on the ball grid array often are very closely spaced and the recesses into which they must be located are very small. Because of the high volume requirements and the highly competitive nature of the electronics industry, the placement of the solder balls on the ball grid arrays must be performed in a minimum amount of time, and for as little cost as is feasible. The handling, control and placement of the solder balls often is a critical portion of this operation.

Key factors in designing a solder ball placement apparatus and method include the speed at which the placement can be accomplished, the accuracy and yield of the process, the cost of the equipment to perform the process, the reliability of the equipment, etc. Considering the extremely small size of these solder balls, which can range in diameter down to 5 mils and potentially smaller, the high number of solder balls required for the ball grid arrays to interconnect today's high density chips, and the precision required in the placement of the solder balls, achieving high yields at high throughput rates has been difficult.

One limitation of known ball placement devices and methods has been that they do not always effectively place solder balls in all available template holes. Another limitation has been that such known devices and methods generally have relied on gravitation force to maintain positive control over the solder balls once they are in the template holes. Using such devices and methods, the balls may become dislodged or otherwise be removed from the holes. In some instances, for example, known techniques for cleaning the top surface of the template to remove excess solder balls has resulted in dislodging balls from inside the holes.

Another limitation of some known devices has been a difficulty in removing solder balls from the template holes to place them on the substrate. Solder balls sometimes became lodged in the holes and do not readily come out when desired.

OBJECTS OF THE INVENTION

Accordingly, an object of the present invention is to provide an apparatus and method for the placing solder balls in a ball grid array on a substrate wherein the placement of solder balls onto the substrate is performed accurately.

Another object of the present invention is to provide an apparatus and method for the placing solder balls in a ball grid array on a substrate wherein the placement of solder balls onto the substrate is performed quickly.

Another object of the present invention is to provide an apparatus and method for the placing solder balls in a ball grid array on a substrate wherein the placement of solder balls onto the substrate wherein the solder balls may be reliably onto the substrate.

Another object of the present invention is to provide an apparatus and method for the placing solder balls in a ball grid array on a substrate without requiring the use of gravity to provide for ball motion.

Additional objects and advantages of the invention will be set forth in the description which follows, and in part will be apparent from the description, or may be learned by practice of the invention. The objects and advantages of the invention may be realized and obtained by means of the instrumentalities and combinations pointed out in the appended claims.

SUMMARY OF THE INVENTION

To achieve the foregoing objects, and in accordance with the purposes of the invention as embodied and broadly described in this document, an apparatus is provided for placing solder balls in a pattern on a substrate, e.g., to form a BGA. For dimensional reference, each of the solder balls in a given application has a "solder ball diameter" equal to about the average diameter of the solder balls in the given application. The apparatus according to one aspect of the invention comprises a template having a first plane, a second plane, and a plurality of holes passing substantially orthogonally through the first and second planes parallel to an axis and corresponding in location to the pattern. Each of the holes is slightly larger than the solder ball diameter.

The apparatus according to this aspect of the invention also includes a porous base. The base has first and second planes, wherein the first plane of the base contacts the second plane of the template. The base is permeable to a fluid in a first direction from the first plane of the template toward the second plane of the base.

The apparatus according to this aspect of the invention further includes a fluid controller in fluid communication with the base for selectively causing the fluid to pass through the holes and through the base in the first direction to force the solder balls into the holes.

The base optionally but preferably comprises a carbon material, such as a carbon graphite material. Other porous materials, however, such as porous metals and porous materials comprising resins or rigid polymeric materials also may be used, depending upon the specific application.

The apparatus preferably but optionally may include a backing surface which contacts selected portions of the second plane of the base and defines a substantially sealed cavity between the second plane of the base and the backing surface, and wherein the fluid controller is operatively coupled to, and in fluid communication with, the cavity.

The fluid may comprise any one or combination of a range of fluids, but preferably comprises a gas, and more preferably comprises air. The fluid controller preferably comprises a regulated air supply. The actual air supply component may comprise a compressed air tank or source, a shop air source, etc. Appropriate piping and valving are included to selectively impress negative pressure(vacuum) and/or positive air flow and corresponding pressure on the holes of the template, preferably via the chamber or cavities formed at the base and backing surface.

As an optional feature of the apparatus, the template may comprise a metallic material, and the apparatus may further include a magnet disposed opposite the base with respect to the template for magnetically attracting the second plane of the template toward the first plane of the base. This feature may be advantageous, for example, in maintaining the desired contacting of the template and the first plane of the base.

Also with respect to the template, each of the holes may include a first section adjacent to the first plane of the template, wherein the first section extends axially in the first direction from the first plane of the template a distance of at least about the solder ball diameter. In this instance, each of the holes also includes a second section extending from the first section of that hole to the second plane of the template, and the second section has an opening at the first section which is less than the solder ball diameter.

In the presently preferred embodiment of this apparatus, the base is permeable to the fluid in a second direction opposite to the first direction, and the fluid controller has a flow director which selectively causes the fluid to pass through the holes and through the base in the second direction to force the solder balls out of the holes at the first plane of the template.

In accordance with another aspect of the invention, an apparatus is provided for placing solder balls in a pattern on a substrate. The apparatus comprises a template having a first plane, a second plane, and a plurality of holes passing substantially orthogonally through the first and second planes parallel to an axis and corresponding in location to the pattern. Each of the holes is slightly larger than the solder ball diameter.

The apparatus according to this aspect of the invention includes a porous base having first and second planes, wherein the first plane of the base contacts the second plane of the template. The base is permeable to the fluid in a second direction from the second plane of the base toward the first plane of the template.

The apparatus further includes a fluid controller in fluid communication with the base for selectively causing the fluid to pass through the holes in the second direction to force the solder balls out of the holes.

The base optionally but preferably comprises a carbon material. The apparatus may further include a backing surface which contacts selected portions of the second plane of the base and defines a substantially sealed cavity between the second plane of the base and the backing surface. The fluid controller in this instance preferably would be operatively coupled to, and in fluid communication with, the cavity.

The preferred fluid for this aspect of the invention comprises air, although other fluids may be used.

As with the previously-described apparatus, the template comprises a metallic material, and the apparatus may further include a magnet positioned opposite the base from the template for magnetically attracting the second plane of the template toward the first plane of the base.

Also as generally outlined above, each of the holes may include a first section adjacent to the first plane of the template, wherein the first section extends in a first direction from the first plane of the template toward the second plane of the template a distance of at least about the solder ball diameter. In this instance, each of the holes also would include a second section extending from the first section of that hole to the second plane of the template, and the second section would have an opening at the first section which is less than the solder ball diameter.

In accordance with another aspect of the invention, a method is provided for placing solder balls in a pattern on a substrate. The method comprises a first step of contacting a template and a porous base to one another. The template has a first plane, a second plane, and a plurality of holes passing substantially orthogonally through the first and second planes parallel to an axis and corresponding in location to the pattern. Each of the holes is slightly larger than the solder ball diameter. The base has first and second planes. The first plane of the base contacts the second plane of the template. The base is permeable to a fluid in a first direction from the first plane of the template toward the second plane of the base.

The method includes a second step of distributing a plurality of solder balls over the first plane of the template.

The method further includes a third step of selectively causing a fluid to pass through the holes and through the base in the first direction to force the solder balls into the holes.

In preferred aspects of the method, the base comprises a carbon material, and the fluid comprises air.

The method may be carried out so that the template comprises a metallic material, and the method further includes a step of applying a magnetic force to the template to attract the second plane of the template toward the first plane of the base.

In accordance with another aspect of the method, each of the holes may include a first section adjacent to the first plane of the template, wherein the first section extends axially in the first direction from the first plane of the template a distance of at least about the solder ball diameter, and each of the holes also may include a second section extending from the first section of that hole to the second plane of the template, wherein the second section has an opening at the first section which is less than the solder ball diameter.

In according with another preferred yet optional aspect of the method, the base is permeable to the fluid in a second direction opposite to the first direction, and the method includes selectively causing the fluid to pass through the holes and through the base in the second direction to force the solder balls out of the holes at the first plane of the template.

BRIEF DESCRIPTION OF THE DRAWINGS

The accompanying drawings, which are incorporated in and constitute a part of the specification, illustrate presently preferred embodiments and methods of the invention and, together with the general description given above and the detailed description of the preferred embodiments and methods given below, serve to explain the principles of the invention.

DETAILED DESCRIPTION OF THE PREFERRED EMBODIMENTS AND METHODS

Figure 1:
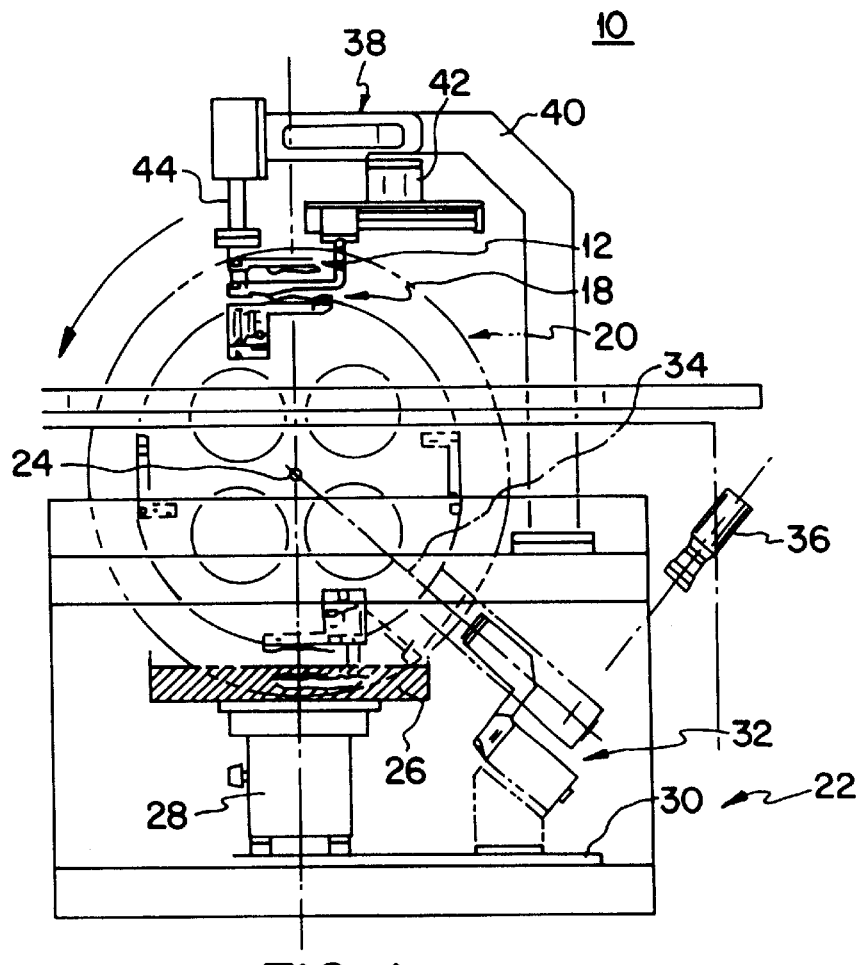
FIG. 1 is a front view of ball grid array fabrication machine for use in accordance with an apparatus according to a first preferred embodiment of the invention.
Figure 2:
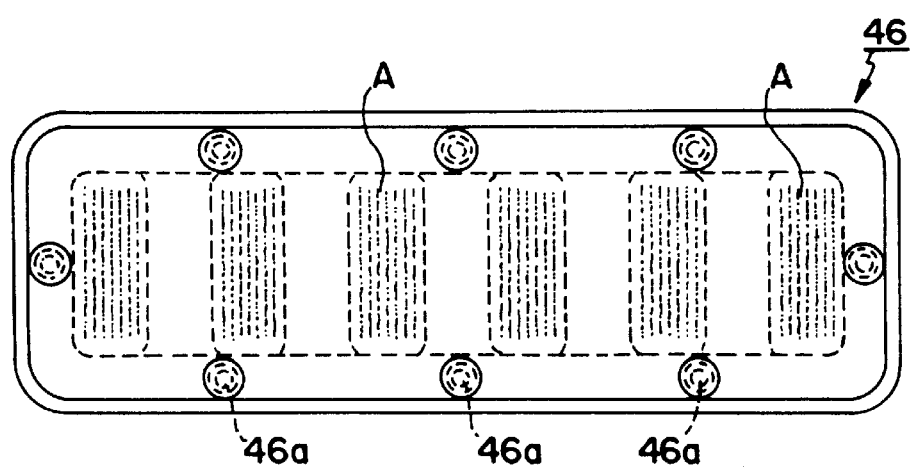
FIG. 2 is a top view of a template for use in connection with the apparatus shown in FIG. 1.

Reference will now be made in detail to the presently preferred embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in this section in connection with the preferred embodiment and method. The invention according to its various aspects is particularly pointed out and distinctly claimed in the attached claims read in view of this specification, and appropriate equivalents.

In accordance with one aspect of the invention, an apparatus is provided for placing solder balls in a pattern on a substrate. Each of the solder balls has a solder ball diameter 14a, which may be used as a reference in defining or describing distances and other relationships, as described above.

A ball grid array processing machine 10 for use in connection with a first preferred embodiment of the invention is shown in FIG. 1. Machine 10 includes an apparatus 12 for placing solder balls 14 (FIG. 3) on substrates 16 (FIG. 6) to create ball grid arrays. A tooling fixture 18 holds substrate in place. Apparatus 12 and fixture are mounted on a frame 20 as depicted in FIG. 1. Frame is further mounted to the machine chassis 22 at a central axis 24 (shown for reference). A reservoir 26 retains solder balls to be placed on substrate 16. Reservoir is mounted on a table 28 which is also mounted to chassis through a support plate 30. An engagement mechanism 32 is mounted along a radius 34 (shown for reference). Engagement mechanism is for moving fixture to a position where substrate 16 is in contact with apparatus 12. A vision system 36 may be included to monitor the position of engagement mechanism. Machine 10 further includes a positioning arrangement 38 mounted to chassis by a support 40. Positioning arrangement is for loading and unloading substrate 16s to and from fixture and locating fixture relative to apparatus 12. Frame rotates about axis in a manner to allow apparatus 12 and fixture to be moved from reservoir to positioning arrangement. Positioning arrangement includes a loading arm 42 for loading and unloading substrate 16s to and from machine 10. Positioning arrangement further includes a positioning arm 44 for positioning of fixture relative to apparatus 12. Machine 10 operates as generally described in U.S. Pat. No. 5,499,487 except as otherwise disclosed herein.

In accordance with this aspect of the invention, the apparatus includes a template having a first plane, a second plane, and a plurality of holes passing substantially orthogonally through the first and second planes parallel to an axis and corresponding in location to the pattern. Each of the holes is slightly larger than the solder ball diameter 14a.

In accordance with the preferred embodiment of the invention, apparatus 12 includes a template 46 for positioning solder balls 14 according to the desired BGA pattern and spacing. Template 46 preferably will correspond to the individual characteristics, such as size, shape and pattern, for the substrate 16 being processed. Because a given machine typically is adapted to process many different types and sizes of substrate 16s, the template used will vary from one application to the next. Therefore, other templates besides the one shown and described herein may be used, as will be understood by persons of ordinary skill in the art. The solder balls used in such applications also may vary in size from one application to another, although they typically will have a single diameter for a given application. The "solder ball diameter" as used herein refers to a representative or average solder ball diameter for the given application. The solder ball diameter as referred to herein is designated by reference numeral 14a.

Template 46 has a first plane 48, a second plane 50, which in this instances are parallel to one another. Template 46 may be made from a variety of materials, provided the template 46 has adequate structural rigidity, sufficient precision of hole placement in the ball array, adequate electrostatic properties, and provides for an adequate template life. The preferred materials are metals, such as stainless steel.

Template 46 includes a plurality of holes 52 passing substantially orthogonally through first and second planes 48 and 52 parallel to an axis 54 and corresponding in location to the pattern of the BGA. Holes 52 preferably are disposed so that their longitudinal axes are orthogonal (90 degrees) with respect to the first and second planes 48 and 50. Holes 52 in this embodiment thus are parallel to axis 54 passing through any one of the holes. As noted, holes 52 are arranged in a pattern to match the pattern of the ball grid array for which they are intended to populate with solder balls 14. Each of the holes 52 is slightly larger than solder ball diameter 14a, so that the balls can easily fall or otherwise work themselves into the holes. The diameter of the holes is sufficiently small, however, so that there is not undue movement of the solder balls 14 in the hole, and so that only one solder ball populates each hole. The tolerances with which the solder balls 14 must ultimately be placed on the substrate 16 also is an important factor in determining the size of the holes. Currently-used solder balls typically have solder ball diameters of about 5 mils (thousandths of an inch), 12 mils, and 30 mils, although other sizes and other ranges have been and/or could be used. Each hole 52 preferably is designed to have a depth such that, when the solder ball is retained in the hole, the top of solder ball is roughly flush with the outer surface of the template 46. This corresponds to a depth of about one solder ball diameter 14a.

Further in accordance with the invention, the apparatus includes a porous base having first and second planes. The first plane of the base contacts the second plane of the template. The base is permeable to a fluid in a first direction from the first plane of the template toward the second plane of the base.

Turning to the preferred embodiment, apparatus 12 includes a porous base 56 having a first plane 58 and a second plane 60. Base 56 of base 56 contacts second plane 50 of template 46. Base 56 according to this preferred embodiment has top or plan dimensions generally corresponding to those of template 46. Base 56 according to this embodiment has a thickness of about 0.09 inches.

Figure 3:
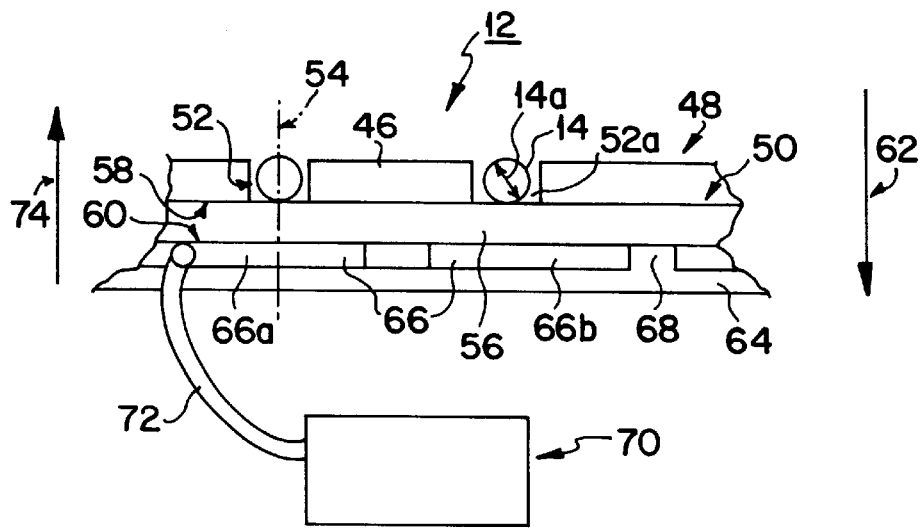
FIG. 3 is a side cutaway view of an apparatus for placing solder balls on a substrate to form a ball grid array in accordance with the first preferred embodiment of the invention.

Base 56 is a porous material which is permeable to working fluids such as air, at least in first direction 62 from first plane 48 of template 46 toward second plane 60 of base 56, as shown by arrow 62 in FIG. 3. Base 56 may be fabricated, for example, from porous carbon material, such as porous carbon or sintered carbon graphite.

In this preferred embodiment porous base 56 is made of a porous carbon with a porosity of about 8 to 15% by volume, and more preferably about 10% by volume. The porous carbon density 15 is about 1.73 grams per cubic centimeter. The material air permeability is such that about 12 to 20 cubic feet per hour of air at 60 psig will flow through a sample of the material when a 60 psi differential pressure is applied across the sample. The sample for this measurement is 0.18 inch thick and the area over which the pressure is applied id a circle 1.5 inches in diameter.

Apparatus 12 according to this embodiment further includes a backing surface 64 which contacts selected portions of the second plane 60 of base 56. Backing surface 64, together with second plane 60 of base 56, define a substantially sealed cavity 66 between the second plane 60 of base 56 and backing surface 64. Cavity 66 is open to and in fluid communication with the inward end 52a of holes 52.

Figure 4A:
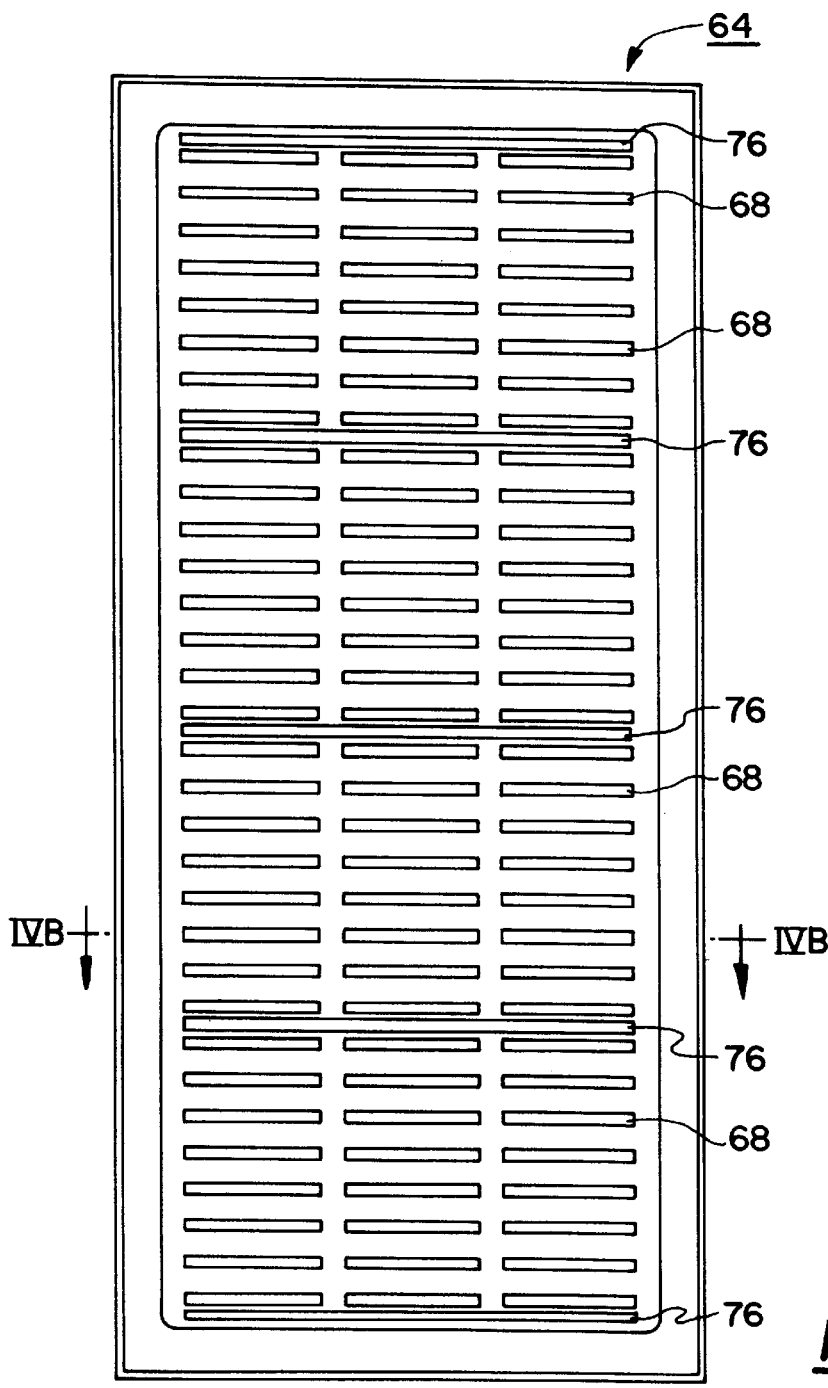
FIG. 4 is a top view of the backing plate according to the preferred embodiments of the invention.
Figure 4B:
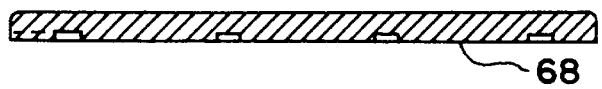

Cavity 66 may comprise a single chamber in which a fluid, in this case air, is held. This is not, however, limiting. Alternatively, for example, and preferably, cavity 66 comprises a plurality of individual chambers 66a, 66b, . . . , each of which is associated with a region or other subset of holes 52. As shown in FIG. 4, for example, backing plate may comprise a manifold which includes a plurality of ribs or walls 68. In conjunction with second plane 60 of porous base 56, these ribs or walls 68 define a plurality of chambers 66a, 66b, . . . between backing surface 64 and second plane 60 of base 56.

Further in accordance with this aspect of the invention, the apparatus 12 includes a fluid controller in fluid communication with the base for selectively causing the fluid to pass through the holes and through the base in the first direction to force the solder balls 14 into the holes. The fluid controller preferably is operatively coupled to, and in fluid communication with, the cavity.

As implemented in the first preferred embodiment, apparatus 12 includes a fluid controller 70 in fluid communication with base 56 for selectively causing the fluid, i.e., air, to pass through holes 52 and through base 56 in first direction 62 to force solder balls 14 into holes 52. Fluid controller 70 in this embodiment is operatively coupled to backing surface 64, so that it is operatively coupled to and in fluid communication with cavity chambers 66a, 66b, . . .

Fluid controller 70 in this preferred embodiment comprises a pneumatic system which includes a source of pneumatic flow, bi-directionally. Examples of such a system would include, for example, an air pump, compressed air tank, a vacuum pump, or a vacuum reservoir. Fluid controller 70 includes associated piping and valving 72 so that, under the control of an operator or automated control device, fluid controller 70 can regulate the flow of air through cavity 66, including chambers 66a, 66b, . . . , and thus through holes 52. This regulated flow can be directed in the first direction 62, so that air flows into holes 52, i.e. from first plane 48 of template 46 to its second plane 50, or in a second direction 74 substantially opposite first direction 62, i.e. out of holes 52, from second plane 50 of template 46 to its first plane 48. This air flow makes corresponding changes in the pressure at the interface between second plane 50 of template 46 and first plane 58 of base 56, so that solder balls 14 are forced into the holes during a negative pressure (vacuum) cycle, for example, as balls are being loaded into the template and moved to the substrate 16. Forcing the solder balls 14 into the holes, as referred to herein, includes securely holding or retaining the balls in place in the holes after they have been seated in the holes.

Because in practice this process typically would be automated, fluid controller 70 also may include a process controller, such as programmable logic controller, for automatically controlling the actuation of the valving to control the flow of air, for example, from the negative pressure cycle as described above to a positive pressure cycle as described below, and so on.

As an optional aspect of the apparatus of this first preferred embodiment, apparatus 12 may be adapted to include a template comprised of a magnetic material, and a magnet 76 disposed opposite the base with respect to the template for magnetically attracting the second plane of the template toward the first plane of the base. This aids in maintaining intimate contact between second plane of template 46 and base 56 of base. A plurality of magnets 76 preferably are positioned within various ones of the chambers formed by walls in backing plate.

The attachment of the template to the base may be accomplished by any of the common means of removable attachment such as screws, bolts, magnetic attachment with pin alignment, etc. Preferred methods of attachment include screws, screws with magnetic attachment, and magnetic attachment with alignment pins. It is desirable for the template to be easily removed from the base for replacement because the templates need to be changed as the ball grid array pattern of the substrate 16 receiving the solder balls 14 is changed. The magnetic attachment allows for very quick removal and replacement of the template, but provides a sufficiently strong means of attachment to prevent ballooning of the template when the differential air pressure at the outer surface of the base 56 is positive. This can occur when the balls are being released from the template. A combination of screws or other forms of quick release fasteners with magnetic attachment provides for an optimum combination of ease of replacement and strength of attachment.

Apparatus 12 preferably has bi-directional flow capability so that solder balls 14, once placed in holes, may be forcefully removed, or their removal may be facilitated, by positive pressure or air flow out of the holes. Accordingly, in apparatus 12, base 56 is permeable to the fluid (here air), in second direction from second plane 60 of base 56 toward first plane 48 of template 46. Fluid controller 70 selectively causes the fluid to pass through holes 52 in second direction 74 to force solder balls 14 out of holes 52.

In accordance with another aspect of this invention, each of the holes may include a first section adjacent to the first plane of the template, wherein the first section extends in a first direction from the first plane of the template toward the second plane of the template a distance of at least about the solder ball diameter, and each of the holes also may include a second section extending from the first section of that hole to the second plane of the template. The second section in this instance has an opening at the first section which is less than the solder ball diameter 14a.

Figure 5:
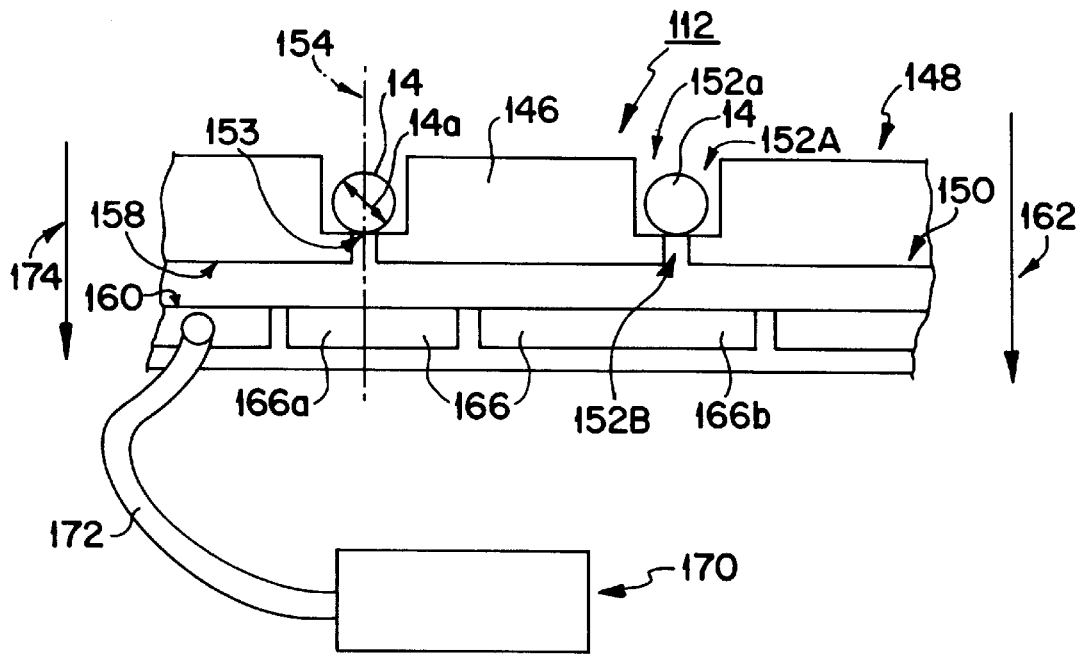
FIG. 5 is a side cutaway view of an apparatus for placing solder balls in a ball grid array on a substrate, in accordance with a second preferred embodiment of the invention.

An apparatus 112 according to a second preferred embodiment of the invention which incorporates these features is illustrated in side cutaway in FIG. 5. As in the first preferred embodiment, apparatus 112 includes a template 148, porous base 156, and backing surface 164, essentially as described above. In this embodiment, however, holes 52 in template 146 differ from those of the first preferred embodiment in the following respects. In template 146 of this embodiment, each of the holes 152 includes a first section 152A adjacent to first plane 148 of template 146. Each first section 152A comprises a substantially cylindrical hole. In each such hole, first section 152A extends in first direction 162 from first plane 148 of template 146 toward second plane 150 of template 146 a distance of at least about one solder ball diameter 14a.

In addition, each of holes 152 further includes a second section 152B extending from first section 152A of that hole to second plane 150 of template 146. Second section 152B also is substantially cylindrical. Second section 152B includes an opening 153 at first section 152 which is less than the solder ball diameter 14a. First and second sections 152 A and 152B are in fluid communication, so that air passes through both sections into or out of cavity 166 and its chambers 166a, 166b, . . .

As fluid controller 170 creates negative pressure (vacuum) in cavity 166, the solder balls 14 are drawn to the center of holes 152 and are drawn down in first section 152A to abut the shoulder of opening 153 at the intersection of first and second sections 152A and 152B. These feature help center the solder balls 14 in the first section 152A of each hole 152. Because the second section 152B is smaller in diameter than one solder ball diameter 14a, the solder balls 14 abut the ledge or shoulder of the first and section interface 153, but cannot pass into the second section 152B of holes 152. As the flow is reversed and fluid controller 170 causes positive pressure to flow, the solder balls 14 are pushed from holes 152 out of template 146 and onto the substrate 16.

These features also help to reduce the kinetic energy in the solder ball 14 after it is captured in the hole 152. Some of the ball handling apparatus of prior art designs have experienced a problem wherein the residual kinetic energy of the solder balls 14 during ball placement cause the balls to bounce around in the hole or to circle around the rim of the hole. This results in poor or inadequate ball placement when the ball is released from the hole. By using air flow and pressure to secure the balls well in the hole, this undesirable phenomenon can be limited or avoided altogether.

Figure 6:
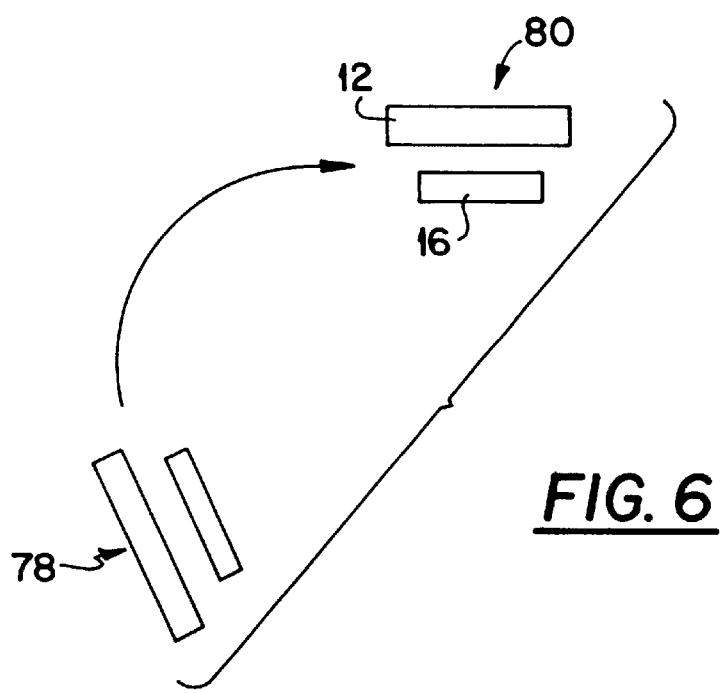
FIG. 6 is a diagram which illustrates an alternative embodiment of the machine in which the apparatus according to the preferred embodiments of the invention may be used.

The apparatus according to either the first or the second embodiment may be advantageous implemented in a machine as depicted in FIG. 1. Other embodiments and arrangements, however, could be used advantageously with the apparatus described herein. FIG. 6, for example, shows apparatus 12 or 112 in a configuration in which the apparatus is loaded with solder balls 14 at a location 78 corresponding to about 200 to 210 decrees from the positive x axis in a machine essentially as shown in FIG. 1. Apparatus is loaded with balls, for example, by distributing balls over first plane 48 of template, e.g., in known fashion such as is generally described in U.S. Pat. No. 5,499,487, and is as commercially known in other examples. During this loading or filling process, fluid controller 70 or 170 applies negative pressure, or vacuum, so that solder balls 14 are pulled into holes 52 or 152 as they enter the perimeter of those holes, and the solder balls are securely retained in the holes once they fall into them.

Once the template is fully populated with balls at this location, the substrate 16 is moved to contact the template. At this stage, the combined apparatus and contacting substrate 16 are moved to a top dead center or 90-degree location 80. At location 80, fluid controller 70 or 170 reverses air flow so that air flows out of hoes 52 or 152, and the balls 14 are thus pushed from the holes and onto substrate 16.

Figure 7:
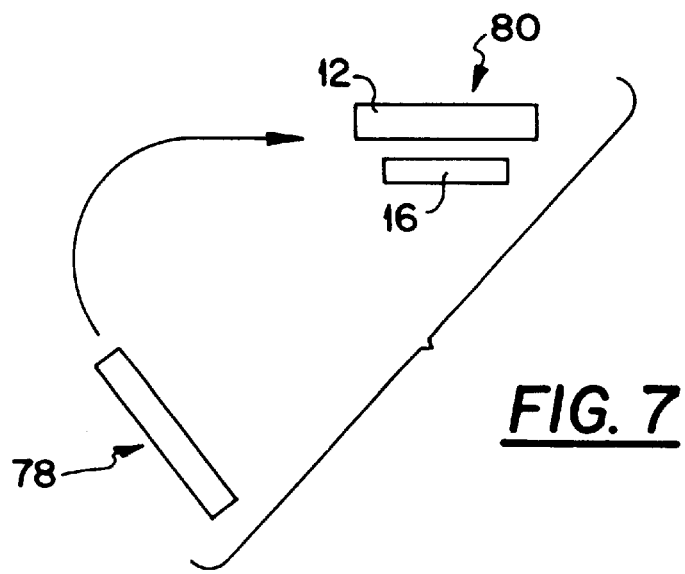
FIG. 7 is a diagram which illustrates another alternative embodiment of the machine in which the apparatus according to the preferred embodiments of the invention may be used.

A second optional implementation of the apparatus of the first and second embodiment is illustrated in FIG. 7. In this embodiment, apparatus 12 or 112 initially is located at position 78, where template 46 or 146 is filled with solder balls 14 as described above. Fluid controller 70 or 170 applies a vacuum so that the balls 14 are retained in holes 52 or 152. Apparatus then is moved to location 80, where substrate 16 is moved to apparatus 12 or 112 and contacts the first plane 48. Fluid controller 70 or 170 then reverses air flow so that positive pressure is applied to chamber 66 or 166 and air flows out of holes 152 or 152. This forces balls 14 out of holes 52 or 152, and onto substrate 16.

Figure 8:
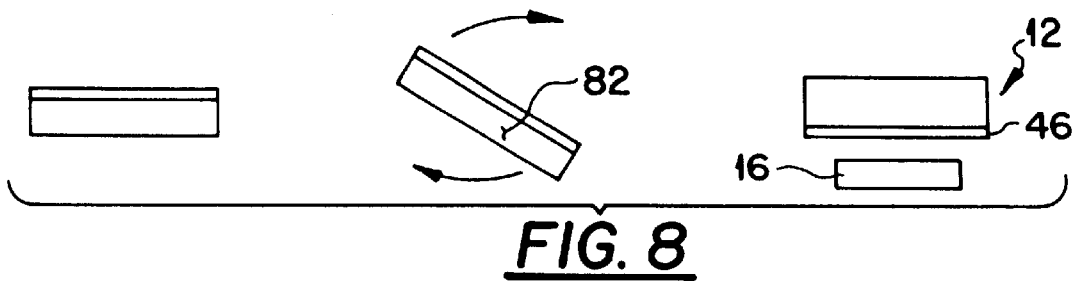
FIG. 8 is a diagram which illustrates yet another alternative embodiment of the machine in which the apparatus according to the preferred embodiments of the invention may be used.

Another optional implementation of the apparatus of the first and second embodiment is illustrated in FIG. 8. In this embodiment, apparatus 12 or 112 rotates about an axis 82. More specifically, apparatus 12 or 112 is initially disposed so that first plane 48 or 148 of template 46 or 146 is disposed upwardly as shown in the drawing figure. At this location, solder balls 14 are distributed over template 46 or 146 as generally described above to populate all of the holes 52 or 152. Fluid controller 70 or 170 applies a vacuum during this process, as described above.

Once template 46 or 146 is fully populated, apparatus 12 or 112 rotates about axis 82 by 180 degrees so that first plane 48 and 148 of template 46 or 146 is disposed downwardly. Substrate 16 then is brought into contact with first plane 48 or 148 of template 46 or 146. Fluid controller 70 or 170 then reverses air flow as generally described above to push solder balls 14 out of holes 52 or 152 and thereby facilitate the placement of balls 14 onto substrate 16 in correspondence with pattern A.

Additional advantages and modifications will readily occur to those skilled in the art. Therefore, the invention in its broader aspects is not limited to the specific details, representative devices and methods, and illustrative examples shown and described. Accordingly, departures may be made from such details without departing from the spirit or scope of the general inventive concept as defined by the appended claims and their equivalents.

What is claimed is:

1. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a first direction from the first plane of the template toward the second plane of the base; and a fluid controller in fluid communication with the base for selectively causing the fluid to pass through the holes and through the base in the first direction to force the solder balls into the holes, wherein the base comprises a carbon material.

2. An apparatus as recited in claim 1, wherein the fluid comprises air.

3. An apparatus as recited in claim 1, wherein:

each of the holes includes a first section adjacent to the first plane of the template, the first section extending axially in the first direction from the first plane of the template a distance of at least about the solder ball diameter; and each of the holes also includes a second section extending from the first section of that hole to the second plane of the template, the second section having an opening at the first section which is less than the solder ball diameter.

4. An apparatus as recited in claim 1, wherein:

the base is permeable to the fluid in a second direction opposite to the first direction; and the fluid controller has a flow director which selectively causes the fluid to pass through the holes and through the base in the second direction to force the solder balls out of the holes at the first plane of the template.

5. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a first direction from the first plane of the template toward the second plane of the base;

a fluid controller in fluid communication with the base for selectively causing the fluid to pass through the holes and through the base in the first direction to force the solder balls into the holes; and a backing surface contacting selected portions of the second plane of the base and defining a substantially sealed cavity between the second plane of the base and the backing surface, and wherein the fluid controller is operatively coupled to, and in fluid communication with, the cavity.

6. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a first direction from the first plane of the template toward the second plane of the base; and a fluid controller in fluid communication with the base for selectively causing the fluid to pass through the holes and through the base in the first direction to force the solder balls into the holes, wherein:
the template comprises a metallic material; and
the apparatus further includes a magnet disposed opposite the base with respect to the template for magnetically attracting the second plane of the template toward the first plane of the base.

7. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a second direction from the second plane of the base toward the first plane of the template; and a fluid controller in fluid communication with the base for selectively causing the fluid to pass through the holes in the second direction to force the solder balls out of the holes, wherein the base comprises a carbon material.

8. An apparatus as recited in claim 7, wherein the fluid comprises air.

9. An apparatus as recited in claim 7, wherein:
each of the holes includes a first section adjacent to the first plane of the template, the first section extending in the first direction from the first plane of the template toward the second plane of the template a distance of at least about the solder ball diameter, and
each of the holes also includes a second section extending from the first section of that hole to the second plane of the template, the second section having an opening at the first section which is less than the solder ball diameter.

10. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a second direction from the second plane of the base toward the first plane of the template;

a fluid controller in fluid communication with the base for selectively causing the fluid to pass through the holes in the second direction to force the solder balls out of the holes; and a backing surface contacting selected portions of the second plane of the base and defining a substantially sealed cavity between the second plane of the base and the backing surface, and wherein the fluid controller is operatively coupled to, and in fluid communication with, the cavity.

11. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a second direction from the second plane of the base toward the first plane of the template; and a fluid controller in fluid communication with the base for selectively causing the fluid to pass through the holes in the second direction to force the solder balls out of the holes, wherein:
the template comprises a metallic material; and
the apparatus further includes a magnet positioned opposite the base from the template for magnetically attracting the second plane of the template toward the first plane of the base.

12. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a first direction from the first plane of the template toward the second plane of the base and the base being permeable to the fluid in a second direction from the second plane of the base toward the first plane of the template; and a fluid controller in fluid communication with the base for selectively causing the fluid to pass through the holes and through the base in at least one of the first and second directions, the fluid controller when causing fluid to pass through the holes in the first direction thereby forcing the solder balls into the holes, and the fluid controller when causing the fluid to pass through the holes in the second direction thereby forcing the solder balls out of the holes, wherein the base comprises a carbon material.

13. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a first direction from the first plane of the template toward the second plane of the base;

a fluid controller in fluid communication with the base for selectively causing the fluid to pass through the holes and through the base in the first direction to force the solder balls into the holes; and a backing surface contacting selected portions of the second plane of the base and defining a substantially sealed cavity between the second plane of the base and the backing surface, and wherein the fluid controller is operatively coupled to, and in fluid communication with, the cavity, wherein the cavity comprises a plurality of individual chambers, each of the chambers being associated with a region or other subset of the holes.

14. An apparatus as recited in claim 13, wherein the backing surface comprises a plurality of ribs defining the individual chambers.

15. An apparatus for placing solder balls in a pattern on a substrate, each of the solder balls having a solder ball diameter, the apparatus comprising:

a template having a first plane, a second plane, and a plurality of holes passing substantially orthogonally through the first and second planes parallel to an axis and corresponding in location to the pattern, each of the holes being slightly larger than the solder ball diameter;

a porous base having first and second planes, the first plane of the base contacting the second plane of the template, the base being permeable to a fluid in a second direction from the second plane of the base toward the first plane of the template;

a fluid controller in fluid communication with the base for selectively causing the fluid to pass through the holes in the second direction to force the solder balls out of the holes; and a backing surface contacting selected portions of the second plane of the base and defining a substantially sealed cavity between the second plane of the base and the backing surface, and wherein the fluid controller is operatively coupled to, and in fluid communication with, the cavity, wherein the cavity comprises a plurality of individual chambers, each of the chambers being associated with a region or other subset of the holes.

16. An apparatus as recited in claim 15, wherein the backing surface comprises a plurality of ribs defining the individual chambers.

* * * * *